(12) United States Patent
Tam

(10) Patent No.: US 7,078,095 B2
(45) Date of Patent: *Jul. 18, 2006

(54) ADHESIVE FILM EXHIBITING ANISOTROPIC ELECTRICAL CONDUCTIVITY

(75) Inventor: Man C. Tam, Mississauga (CA)

(73) Assignee: Xerox Corporation, Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/886,730

(22) Filed: Jul. 7, 2004

(65) Prior Publication Data

US 2006/0008626 A1 Jan. 12, 2006

(51) Int. Cl.
*B32B 5/16* (2006.01)
*B32B 7/12* (2006.01)

(52) U.S. Cl. ............... 428/352; 428/328; 428/344; 428/355 RA; 428/356; 174/259

(58) Field of Classification Search ............... 428/328, 428/352, 356, 355 R, 355 RA; 174/259
See application file for complete search history.

(56) References Cited

U.S. PATENT DOCUMENTS

| 3,795,047 | A | * | 3/1974 | Abolafia et al. ............... 29/843 |
| 4,143,103 | A | | 3/1979 | Sheridon |
| 4,176,854 | A | | 12/1979 | Hill et al. |
| 4,261,653 | A | | 4/1981 | Goodrich |
| 4,438,160 | A | | 3/1984 | Ishikawa et al. |
| 4,606,962 | A | * | 8/1986 | Reylek et al. ............... 428/148 |
| 4,902,857 | A | * | 2/1990 | Cranston et al. .......... 174/94 R |
| 5,001,302 | A | * | 3/1991 | Atsumi ...................... 174/94 R |
| 5,225,966 | A | * | 7/1993 | Basavanhally et al. ..... 361/774 |
| 5,362,421 | A | | 11/1994 | Kropp et al. |
| 5,389,945 | A | | 2/1995 | Sheridon |
| 5,685,939 | A | | 11/1997 | Wolk et al. |
| 5,754,332 | A | | 5/1998 | Crowley |
| 5,903,056 | A | * | 5/1999 | Canning et al. ............. 257/773 |
| 6,020,059 | A | * | 2/2000 | Yamada et al. ............. 428/328 |
| 6,042,894 | A | * | 3/2000 | Goto et al. .................. 427/504 |
| 6,180,226 | B1 | * | 1/2001 | McArdle et al. ............. 428/332 |
| 6,338,195 | B1 | * | 1/2002 | Tsukagoshi et al. .......... 29/832 |
| 6,352,775 | B1 | * | 3/2002 | Sasaki et al. ................ 428/403 |
| 6,423,172 | B1 | * | 7/2002 | McArdle et al. .......... 156/272.2 |
| 6,487,002 | B1 | | 11/2002 | Biegelsen |
| 6,703,074 | B1 | | 3/2004 | Sacripante et al. |
| 6,747,723 | B1 | * | 6/2004 | Hanakawa et al. ......... 349/147 |
| 2002/0014615 | A1 | | 2/2002 | Yamada et al. |
| 2003/0017327 | A1 | | 1/2003 | Paik et al. |
| 2003/0178132 | A1 | | 9/2003 | Shinozaki |

FOREIGN PATENT DOCUMENTS

| EP | 0 757 407 B1 | 4/2001 |
| EP | 0 692 137 B1 | 4/2002 |

(Continued)

OTHER PUBLICATIONS

NDN 017-0173-9164-0: Design considerations for the implementation of anisotropic conductive adhesive interconnection.

(Continued)

*Primary Examiner*—Cathy F. Lam
(74) *Attorney, Agent, or Firm*—Pepper Hamilton LLP

(57) ABSTRACT

An anisotropic conductive film includes a release layer, an insulating adhesive matrix on the release layer, and conductive particles distributed in the matrix in a substantially uniform pattern. The film may also include a patterned adhesive layer on the release layer, so that the particles are positioned in a pattern that substantially corresponds to the pattern of the patterned adhesive layer.

16 Claims, 4 Drawing Sheets

FOREIGN PATENT DOCUMENTS

EP    0 813 750 B1    6/2003

OTHER PUBLICATIONS

NDN 259-0777-6116-2: Microwave curing of anisotropic conductive film: effects of principal parameters on curing situation.

NDN 259-0775-8277-2: Failure mechanism study of anisotropic conductive film (ACF) packages.

NDN 083-0543-8366-0: A new anisotropic conductive film with arrayed conductive particles.

* cited by examiner

ADHESIVE FILM EXHIBITING ANISOTROPIC ELECTRICAL CONDUCTIVITY

BACKGROUND

1. Technical Field

The description set forth herein generally relates to adhesive films for connecting conductive elements to other items. More particularly, the description relates to adhesive films that may be used to attach a conductive element such as a printed circuit board to another device such as an element of an electronic display.

2. Description of Related Art

Display technologies based on encapsulation of electrophoretic particles, multichromal beads and liquid crystals have many potential applications in fields such as electronic paper and other digital document media. Examples of such electronic display devices include those available from Gyricon LLC of Ann Arbor Mich. and those described in, for example, U.S. Pat. Nos. 6,703,074; 5,389,945; 4,438,160; 4,261,653; 4,143,103; and 4,176,854, each of which is incorporated by reference herein in its entirety. In one such display device, as shown in FIG. 1, bichromal beads, cylinders, crystals or other bichromal or multichromal particles 10 are dispersed in an elastomeric sheet swollen by a fluid 12 and positioned atop a conductive substrate 14 such as a printed circuit board. The particles, fluid and substrate are covered with a transparent layer 16 such as glass or plastic and a transparent conductive material such as indium tin oxide (ITO) 18, and they are sealed to form a re-addressable display material in which the particles rotate in response to an electric or magnetic field that is applied to the conductive substrate.

The conductive substrate is often flexible, and it may include tens, hundreds or even thousands of very small, very closely spaced electrical terminals. The terminals are interconnected by a complex web of traces that provide conductivity between selected elements of the circuit board.

In the assembly of an electric display such as that shown in FIG. 1, it is known to use an anisotropic conductive adhesive, commonly known as a Z-axis adhesive, to connect the circuit board to the display. If the adhesive is conductive across the entire circuit board, it will interfere with the traces by providing additional paths of conductivity between the elements of the board. The anisotropic conductive adhesive provides electrical conductivity only in a direction perpendicular to the connected surfaces and not in a direction parallel to the surfaces. Thus, the anisotropic adhesive does not create undesired additional paths of conductivity between the elements of the circuit board. Anisotropic conductive adhesives typically include conductive particles dispersed throughout an insulating adhesive matrix, such as an epoxy or a polymer. Examples of anisotropic conductive adhesives are further described in U.S. Pat. Nos. 5,685,939 and 5,362,421, each of which is incorporated herein by reference in its entirety.

When used in a display device, the anisotropic film delivers a field from the circuit board to the image formation layer through the conductive particle chains that extend across the thickness of the film, thus electrically connecting the connected circuit board terminals and the image formation layer. A high concentration of conductive particles (e.g., 20%–30%) is currently necessary to provide sufficient electrical conductivity across the layer. However, if the concentration is too high, lateral particle contacts, and thus short circuits, can result between adjacent electrical terminals on the board. This can create a reliability problem in applications requiring a fine pitch. In addition, a high loading of conductive particles can increase the cost of manufacturing, since conductive particles can be expensive.

In addition, because of their random distribution, local variations of particle concentration can occur in an adhesive matrix later. An example of such a particle distribution in a conductive adhesive film 20 is illustrated in FIG. 2, wherein the conductive particles 24 are randomly distributed in the adhesive matrix 22. This distribution may cause non-uniform conductivity across the film. In extreme situations, this can even cause an open circuit in the perpendicular direction or a short circuit in the parallel direction if the distribution is highly varied.

Accordingly, I have found that a need exists for an improved anisotropic conductive adhesive, as well as improved methods of making displays and other electrical devices using an improved anisotropic conductive adhesive.

SUMMARY

In an embodiment, an anisotropic conductive film includes a release layer, an insulating adhesive matrix on the release layer, and conductive particles distributed in the matrix in a substantially uniform pattern. The film may also include a patterned adhesive layer on the release layer, so that the particles are positioned in a monolayer in a pattern that substantially corresponds to the pattern of the patterned adhesive layer. The patterned adhesive layer may be made of, for example, a pattern of raised adhesive elements that project from the release layer. Optionally, the raised adhesive elements have a width that is between about 5% and about 50% of the width of the conductive particles.

In the above-described embodiment, the patterned adhesive layer and/or the matrix may be made of a pressure-sensitive adhesive, a heat-activated adhesive, and/or a light-activated adhesive. Suitable materials include, but are not limited to, copolymers of styrene and acrylate, polyester resins, polyurethane, copolymers of acrylonitrile and vinylidene chloride, polyvinyl acetate, polyvinyl butyral, polyolefins, cyanoacrylates, silicones and epoxies. The conductive particles may be made of gold, silver, nickel, tin, aluminum, a metallic alloy or another material. In the alternative, the particles may be made of polymeric or other soft materials and coated with a conductive material such as gold, silver, nickel, tin, aluminum, lead, indium or an alloy.

In an alternate embodiment, an electronic device includes a conductive substrate, a set of conductive terminals on the substrate, a layer opposing the substrate, a set of conductive terminals attached to the layer and facing the substrate; and an anisotropic conductive film between the layer and the substrate. The film includes conductive particles distributed in an insulating medium in a substantially uniform manner. Optionally, the particles may be positioned in a monolayer in the insulating medium. The materials of the insulating layer and conductive particles may be, for examples, those described in the previous two paragraphs of this description, as well as other materials.

In an alternate embodiment, a method of making a conductive film includes applying an adhesive material to a release substrate so that the adhesive material is passed through a patterned screen or mask before reaching the substrate. The adhesive material forms a patterned adhesive layer on the substrate, such that the pattern of the adhesive corresponds to the pattern of the patterned screen or mask. The method also includes depositing conductive particles on the patterned adhesive layer so that the particles are positioned in a pattern that at least substantially corresponds to the pattern of the patterned adhesive layer. The method also includes applying an insulating matrix layer on the conductive particles.

Optionally, in the method described above, the depositing of conductive particles may be repeated several times to provide a substantially uniform monolayer. Also, after the conductive particles are deposited, particles that do not adhere to the patterned adhesive layer may be removed. Optionally, the method includes vibrating the substrate during or after the depositing step. The application of adhesive material may include screen printing, ink jet printing, spray coating, gravure roll coating, photo patterning and/or other methods. The applying step may include air-knife coating, drawbar coating, solvent extrusion coating and/or other coating methods.

DETAILED DESCRIPTION

Notations and Nomenclature

As used herein, the words "bichromal" and "multichromal" will be used interchangeably to refer to a display or a particle that may exhibit two or more colors. In addition, the words "bead", "particle" and "capsule" are used interchangeably to refer to a bichromal element for a display medium, such as a twisting cylinder, microcapsule, bead, electrophoretic material or any other bichromal or multichromal material that may be modulated by an applied electric or magnetic field. For example, a bichromal bead in an oil-filled capsule may rotate inside the capsule in response to an applied field.

Description

The description that follows generally relates to conductive adhesive films and methods of making them. In an embodiment, the description relates to an anisotropic, conductive, adhesive film that may be used in electronic paper-type displays and other electrical and/or magnetic applications.

Figure 1:
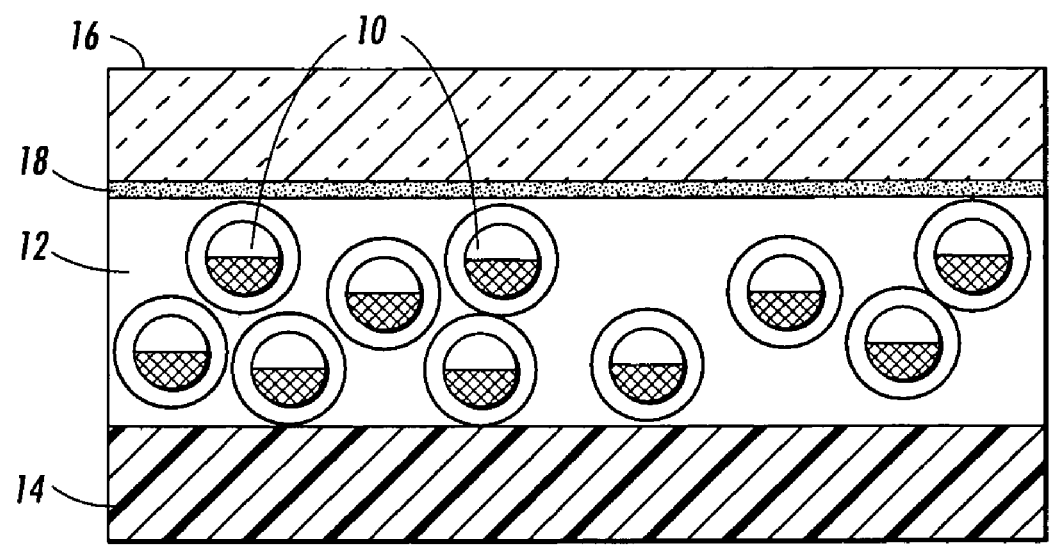
FIG. 1 illustrates a side view of exemplary elements of a prior art electronic display.
Figure 2:
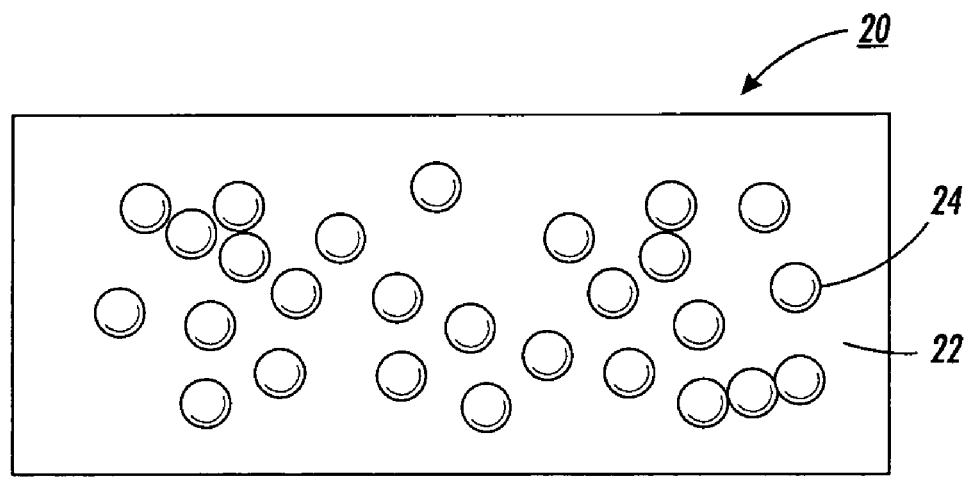
FIG. 2 illustrates an exemplary particle distribution in a prior art conductive adhesive film.
Figure 3:
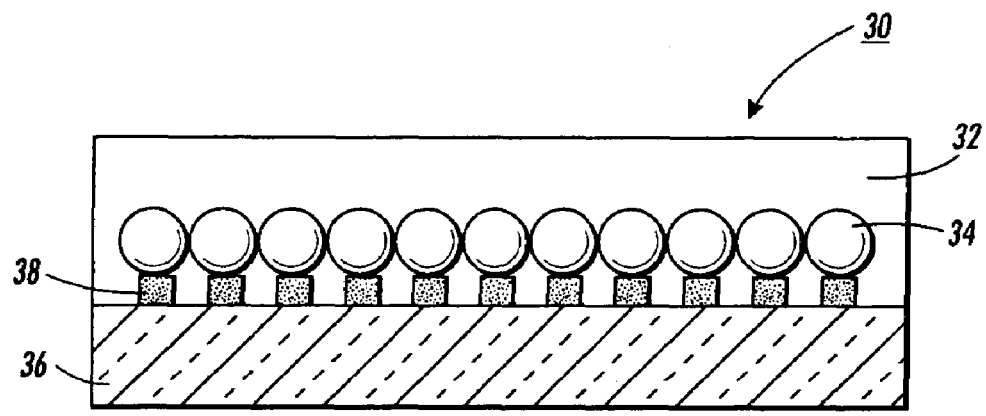
FIG. 3 illustrates exemplary elements of an anisotropic adhesive film according to one embodiment.

FIG. 3 illustrates exemplary elements of an anisotropic adhesive film 30 according to one embodiment. The film 30 includes an insulating adhesive matrix 32, a set of electrically conductive particles 34 and a release substrate 36. A patterned adhesive layer 38 fixes the electrically conductive particles 34 in place to form a desired pattern so that the spacing and positions of neighboring conductive particles can be controlled to design specification. As a result, the risk of lateral particle contacts may be minimized or eliminated.

The adhesive matrix 30 may be made of any suitable adhesive material, including but not limited to pressure-sensitive adhesives, heat-activated adhesives (i.e., those with adhesive properties that change with temperature) and/or light-activated adhesives (i.e., those with adhesive properties that change with light exposure). Exemplary materials include thermoplastic and thermosetting adhesives such as copolymers of styrene and acrylate, polyester resins, polyurethane, copolymers of acrylonitrile and vinylidene chloride, polyvinyl acetate, polyvinyl butyral, polyolefins, cyanoacrylates, silicone and/or epoxy. Other suitable materials may also be used. For fine pitch applications, the insulating adhesive layer may optionally exhibit optical transparency in order to facilitate alignment of the connecting terminals.

Figure 4:
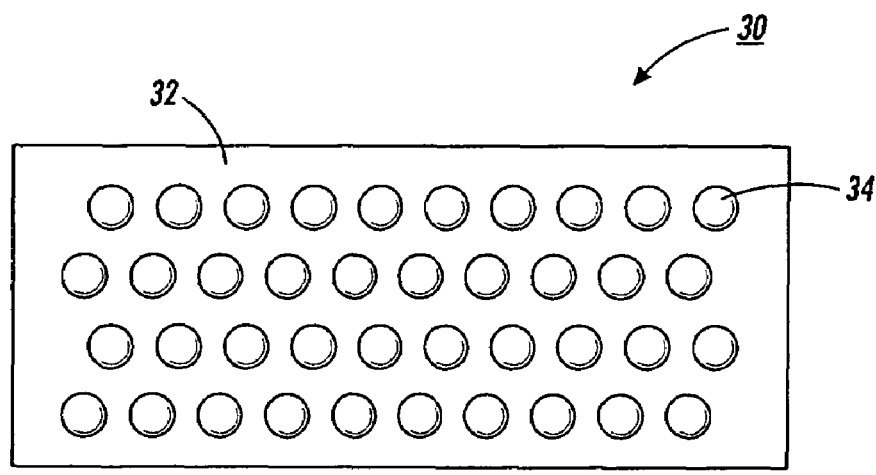
FIG. 4 illustrates a top view of the exemplary film of FIG. 3.

Similarly, the patterned adhesive layer 38 may be made of the same material as the insulating matrix 32, or it may be made of a different adhesive material, including but not limited to pressure-sensitive adhesives, heat-activated adhesives and/or light-activated adhesives, including but not limited to those described in the previous paragraph. The patterned adhesive layer 38 may include dots, ridges or raised elements of adhesive material. The size and center-to-center spacing of the raised elements will depend on the size and desired positioning of the conductive particles. In an embodiment, the lateral area, i.e., the width, of the raised elements may be about 5% to about 50% of the diameter of the conductive particles, although other lateral areas are possible. The raised elements may be arranged in any desired geometry or pattern, such as a fully or partially hexagonal, rectangular or rhomboidal array or pattern, as well as other shapes and positions. An exemplary pattern is shown in the top view of an anisotropic conductive film as shown in FIG. 4.

In an embodiment, the electrically conductive particles 34 are preferably substantially uniform in shape and size. Although spherical elements are shown in FIGS. 3 and 4, other shapes, such as cylinders, cubes and egg-shapes, are possible. The particles may be made of any suitable conductive material, including but not limited to metallic particles or polymeric particles with a conductive coating. When metallic particles are used, suitable materials include gold, silver, nickel, tin, aluminum, alloys of any of these elements, and/or other materials. When polymeric particles with conductive coatings are used, suitable coatings include gold, silver, nickel, tin, indium, lead, aluminum, alloys of any of these elements, and/or other materials. Polymeric particles with conductive coatings may be preferable in applications where a deformable particle is desired. Deformable particles may provide an increased contact area with a connected surface as they deform under application of pressure and/or heat. Exemplary conductive particle sizes include particles having diameters of about 5 to about 500 microns (μm), depending on the desired application.

The release substrate 36 may be made of any commonly-used material with provides a releasable surface, such as polyethylene terephthalate, polyimide, polyvinyl fluoride films, and other materials using a release coating. The release substrate serves as a support and storage medium upon which the film may rest until it is used. The release substrate is typically removed during use.

Figure 5:
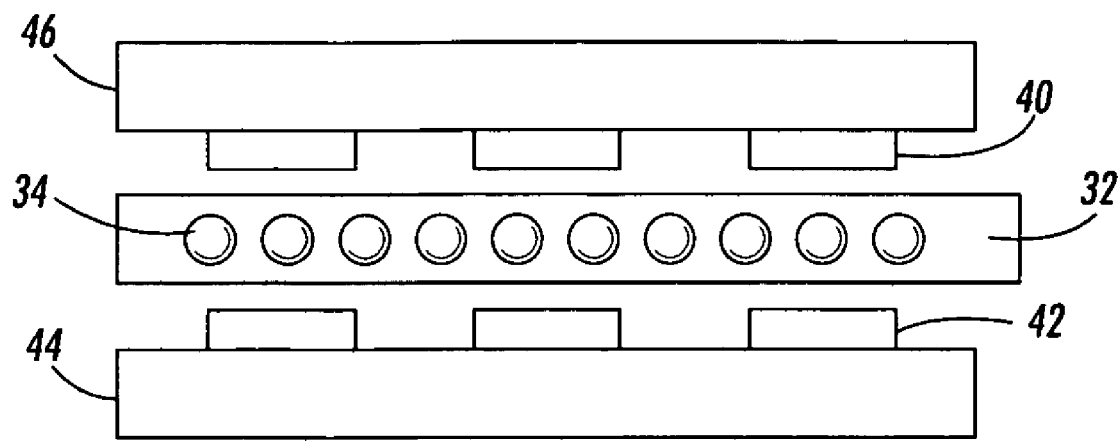
FIG. 5 illustrates a side view of an exemplary device incorporating a patterned conductive adhesive layer.

An exemplary application of an anisotropic conductive adhesive layer is illustrated in FIG. 5. Referring to FIG. 5, the conductive adhesive layer 32 includes a group of conductive elements 34. The layer 32 is positioned between two sets of conductive terminals 40 and 42. A charge or field is generated by or passed through a substrate 44, such as a printed circuit board (PCB) or indium tin oxide (ITO)-coated glass, which may be flexible, to the terminals 42. The field passes from one terminal 42 to another terminal 40 through the anisotropic conductive film 32. A top layer 46, such a PCB or integrated circuit, may cover the film and the terminals 44.

Figure 6:
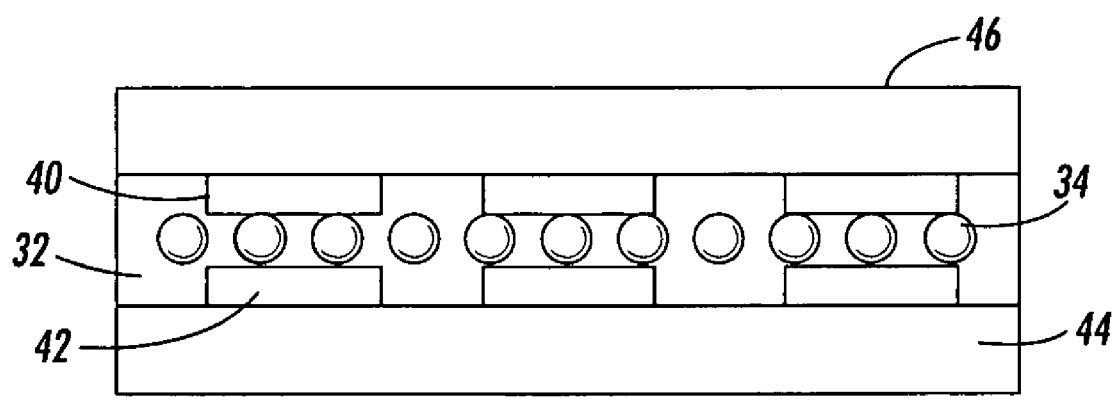
FIG. 6 illustrates a side view of a device as in FIG. 5, using deformable particles.
Figure 7:
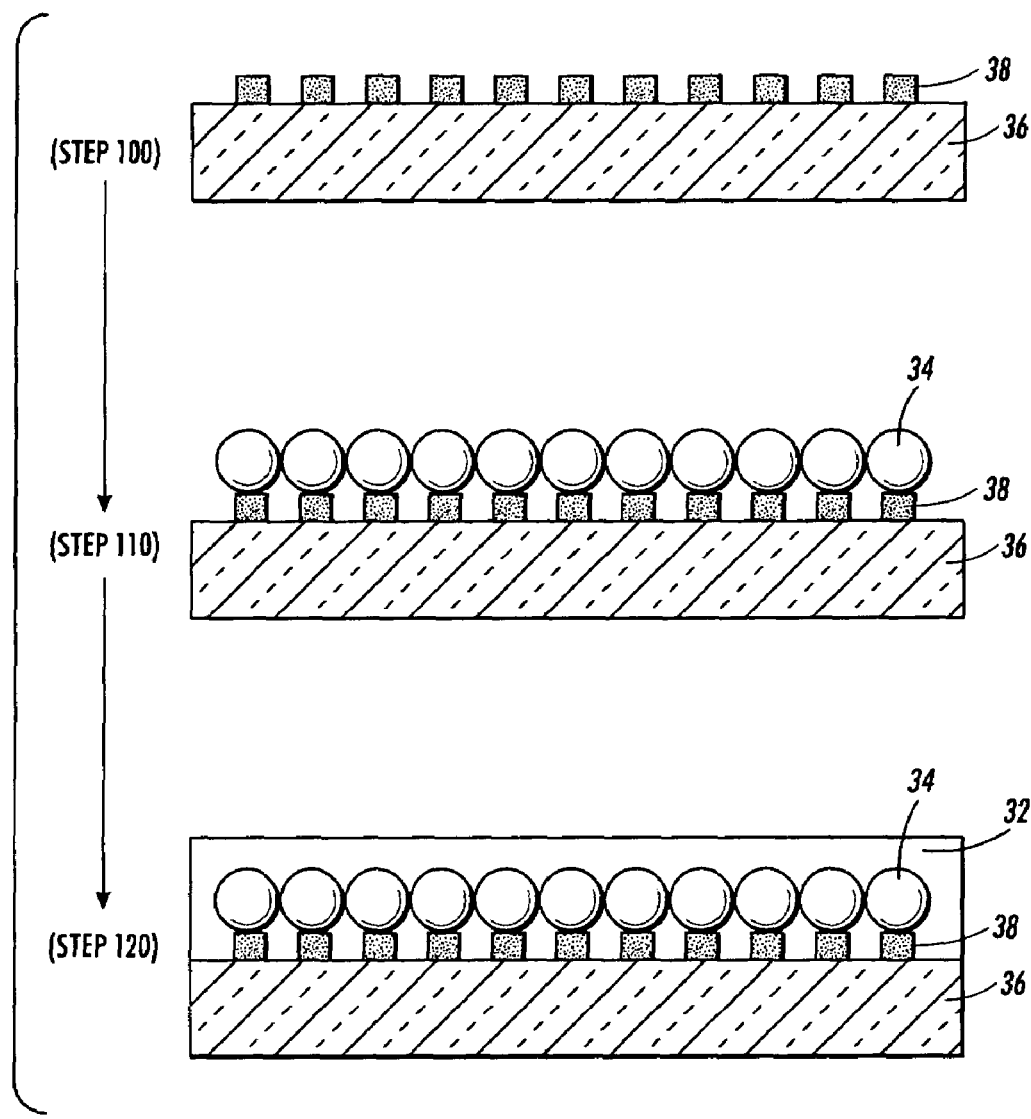
FIG. 7 illustrates exemplary steps in a method of making an anisotropic conductive film.

To create conductivity from the top terminals to the bottom terminals through the conductive particles, the film 32 is sandwiched between the top 46 and bottom 44 layers, as shown in FIG. 6. FIG. 6 illustrates an example wherein the particles 34 are made of a coated polymeric material and are therefore deformable. Thus, when sandwiched in between the terminals 40 and 42, the particles deform and provide a larger conductive surface area that contacts the terminals. When positioned in a monolayer as shown in FIG. 6, the risk of short circuiting that arises from randomly oriented chains of particles is reduced.

In an embodiment, the adhesive layer may be made by coating (step 100) a patterned adhesive layer 38 onto a substrate 36, such as a release substrate, using any suitable coating technique, including coating techniques known in the art such as screen printing, ink jet printing, spray coating, gravure roll coating, and the like. For light activated adhesives, a photo patterning or other suitable technique may be used. To create a desired pattern, the adhesive may be passed through a screen or mask so that the pattern of the adhesive layer corresponds to the pattern of the screen or mask.

Next, a layer of conductive particles 34 may be applied to the adhesive layer 38 using any suitable means (step 110), such as by cascading them over the patterned adhesive layer. Only the capsules that directly contact the patterned adhesive will be retained, yielding an at least substantially uniform, closely-packed, monolayer of coating. Coating uniformity may be further improved by repeating the capsule cascading process two or more times, and also by vibrating the substrate 36 during or after the cascading. Capsules that do not attach to the adhesive may be removed by any number of methods, including the use of gravity, suction and other methods.

Finally, the insulating matrix layer 34 is applied (step 120) using any appropriate solvent coating technique, such as air-knife, drawbar, solvent extrusion and other techniques.

In certain embodiments, the adhesive layer described above may reduce the risk of lateral direction short circuits and perpendicular direction open circuits. The layer may also enhance fine pitch applications by providing a higher packing density, increased conductivity and uniformity with smaller particles.

While the present invention is satisfied by embodiments in many different forms, there is shown in the drawings and described herein in detail, the preferred embodiments of the invention, with the understanding that the present disclosure is to be considered as exemplary of the principles of the invention and is not intended to limit the invention to the embodiments illustrated. Various other embodiments will be apparent to and readily made by those skilled in the art without departing from the scope and spirit of the invention. The scope of the invention will be measured by the appended claims and their equivalents.

What is claimed is:

1. An anisotropic conductive film, comprising:
    a release layer;
    a patterned adhesive layer located on the release layer, wherein, the patterned adhesive layer comprises a pattern of raised adhesive elements that project from the release layer;
    a plurality of conductive particles, wherein the plurality of conductive particles are positioned in a pattern that corresponds to the raised adhesive elements of the patterned adhesive layer, and wherein the raised adhesive elements have a width that is between about 5% and about 50% of the width of the conductive particles; and
    an insulating adhesive matrix applied on the plurality of conductive particles and on the release layer.

2. The film of claim 1 wherein the plurality of conductive particles are positioned in a monolayer that substantially corresponds to the pattern of raised adhesive elements of the patterned adhesive layer.

3. The film of claim 2 wherein at least one of the patterned adhesive layer and the matrix comprises at least one of a pressure-sensitive adhesive, a heat-activated adhesive, and a light-activated adhesive.

4. The film of claim 2 wherein at least one of the patterned adhesive layer and the matrix comprises at least one of a copolymer of styrene and acrylate, a polyester resin, polyurethane, a copolymer of acrylonitrile and vinylidene chloride, polyvinyl acetate, polyvinyl butyral, polyolefin, cyanoacrylate, silicone and an epoxy.

5. The film of claim 1 wherein the conductive particles comprise at least one of gold, silver, nickel, tin, aluminum and an alloy of any of the elements thereof.

6. The film of claim 1 wherein the conductive particles comprise a polymeric material and a coating, wherein the coating comprises at least one of gold, silver, nickel, tin, aluminum, lead, indium and an alloy of any of the elements thereof.

7. An anisotropic conductive film, comprising:
    a release layer;
    a patterned adhesive layer located on the release layer, wherein, the patterned adhesive layer comprises a pattern of raised adhesive elements that project from the release layer;
    a plurality of conductive particles, wherein the plurality of conductive particles are positioned in a monolayer that corresponds to the pattern of raised adhesive elements of the patterned adhesive layer, and wherein the raised adhesive elements have a width that is between about 5% and about 50% of the width of the conductive particles; and
    an insulating adhesive matrix applied on the plurality of conductive particles and on the release layer.

8. The film of claim 7 wherein at least one of the patterned adhesive layer and the matrix comprises at least one of a copolymer of styrene and acrylate, a polyester resin, polyurethane, a copolymer of acrylonitrile and vinylidene chloride, polyvinyl acetate, polyvinyl butyral, polyolefin, cyanoacrylate, silicone and an epoxy.

9. The film of claim 7 wherein at least one of the patterned adhesive layer and the matrix comprises at least one of a pressure-sensitive adhesive, a heat-activated adhesive, and a light-activated adhesive.

10. The film of claim 7 wherein the conductive particles comprise at least one of gold, silver, nickel, tin, aluminum and an alloy of any of the elements thereof.

11. The film of claim 7 wherein the conductive particles comprise a polymeric material and a coating, wherein the coating comprises at least one of gold, silver, nickel, tin, aluminum, lead, indium and an alloy of any of the elements thereof.

12. An anisotropic conductive film, comprising:
    a release layer;
    a patterned adhesive layer located on the release layer, wherein the patterned adhesive layer comprises a pattern of raised adhesive elements that project from the release layer;

a plurality of conductive particles, wherein the plurality of conductive particles are positioned in a pattern that corresponds to the raised adhesive elements of the patterned adhesive layer, and wherein the raised adhesive elements have a width that is between about 5% and about 50% of the width of the conductive particles; and an insulating adhesive matrix applied on the plurality of conductive particles and on the release layer, wherein at least one of the patterned adhesive layer and the matrix comprises at least one of a pressure-sensitive adhesive, a heat-activated adhesive, and a light-activated activated adhesive.

13. The film of claim 12 wherein the plurality of conductive particles are positioned in a monolayer that substantially corresponds to the pattern of raised adhesive elements of the patterned adhesive layer.

14. The film of claim 12 wherein at least one of the patterned adhesive layer and the matrix comprises at least one of a copolymer of styrene and acrylate, a polyester resin, polyurethane, a copolymer of acrylonitrile and vinylidene chloride, polyvinyl acetate, polyvinyl butyral, polyolefin, cyanoacrylate, silicone and an epoxy.

15. The film of claim 12 wherein the conductive particles comprise at least one of gold, silver, nickel, tin, aluminum and an alloy of any of the elements thereof.

16. The film of claim 12 wherein the conductive particles comprise a polymeric material and a coating, wherein the coating comprises at least one of gold, silver, nickel, tin, aluminum, lead, indium and an alloy of any of the elements thereof.

* * * * *